United States Patent [19]

Makino et al.

[11] Patent Number: 5,157,622
[45] Date of Patent: Oct. 20, 1992

[54] INPUT-WEIGHTED TRANSVERSAL FILTER

[75] Inventors: Takashi Makino, Tokyo; Mikio Goto, Chigasaki, both of Japan

[73] Assignee: Kabushiki Kaisha Toshiba, Kawasaki, Japan

[21] Appl. No.: 723,417

[22] Filed: Jun. 28, 1991

[30] Foreign Application Priority Data

Jun. 28, 1990 [JP] Japan .................. 2-171211

[51] Int. Cl.$^5$ .......................................... G06F 15/31
[52] U.S. Cl. ............................ 364/724.16; 364/724.10
[58] Field of Search ..................... 364/724.16, 724.13, 364/724.1

[56] References Cited

FOREIGN PATENT DOCUMENTS 1268306 10/1989 Japan .

Primary Examiner—Tan V. Mai
Attorney, Agent, or Firm—Oblon, Spivak, McClelland, Maier & Neustadt

[57] ABSTRACT

A selector sequentially selects different coefficients during a time interval T. A plurality of coefficient multipliers multiply an input signal sampled at intervals T and coefficients selected by the selector. An input circuit selects, at interval T/2, an input signal supplied at intervals T. A pipeline type adder adds an output signal of the input circuit and output signals of the coefficient multipliers. An output circuit adds an output signal of the adder in an interval of T/2 and outputs the result of the addition as a signal of a period of T.

8 Claims, 12 Drawing Sheets

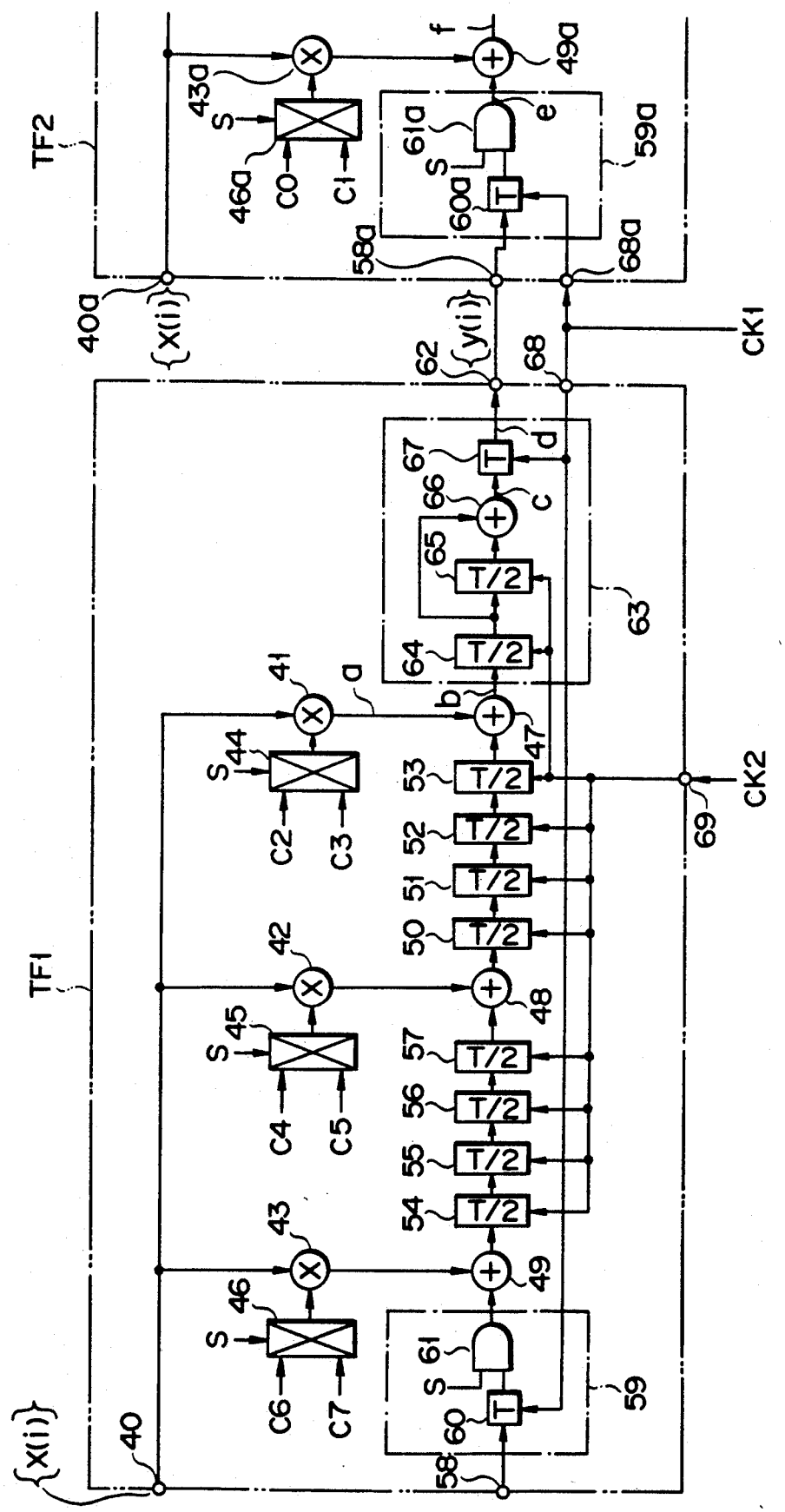
F I G. 1

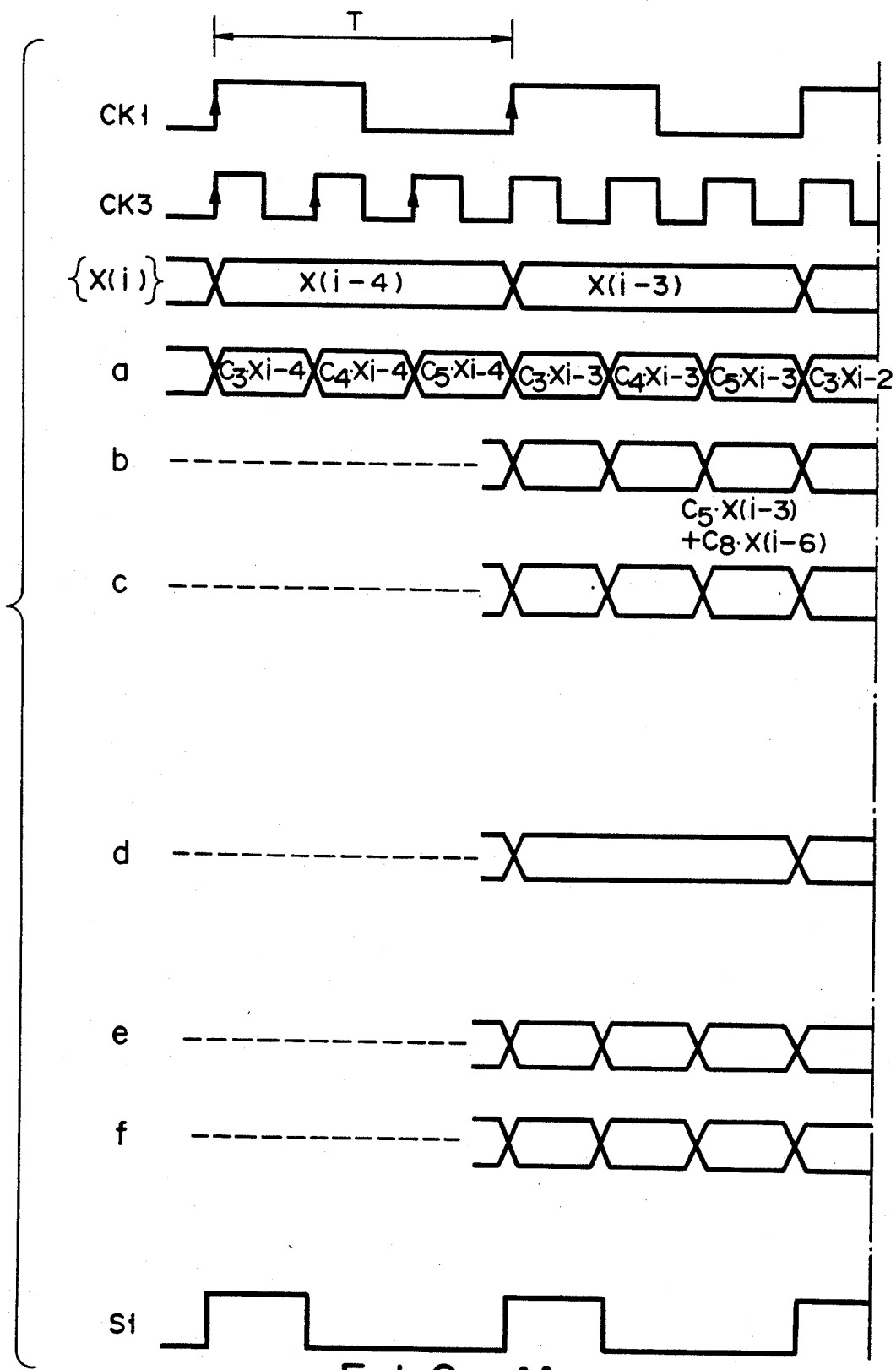
F I G. 4A

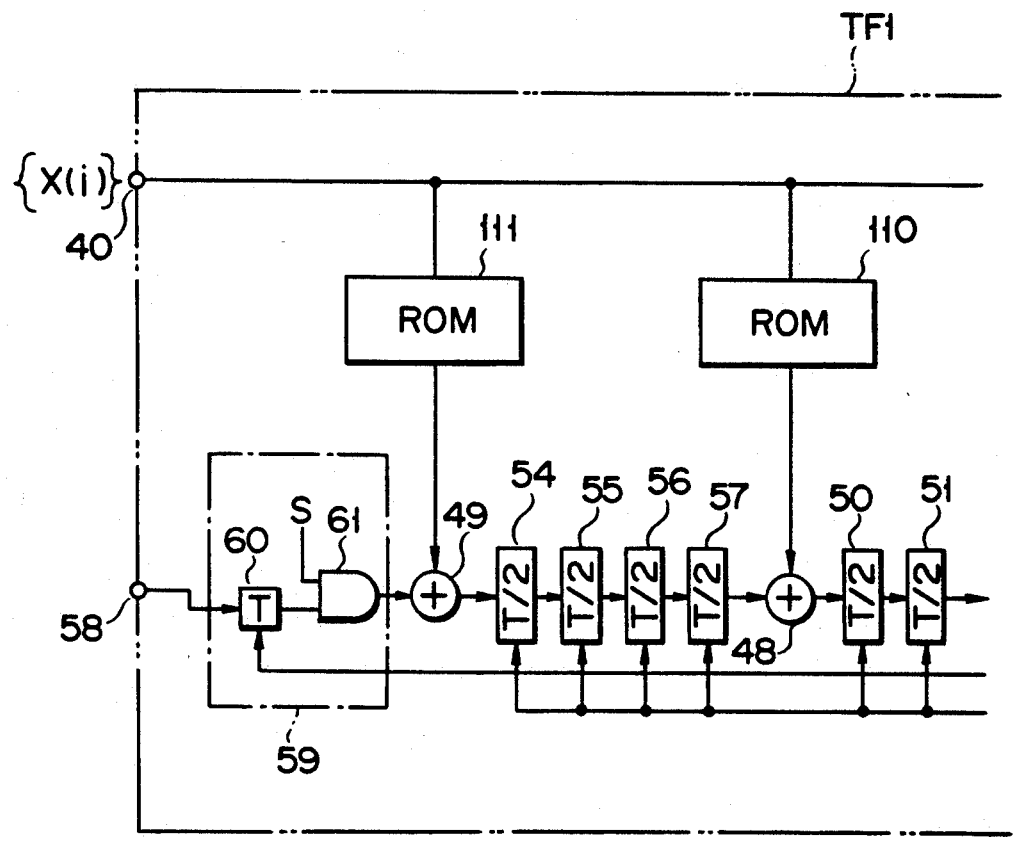
F I G. 5

INPUT-WEIGHTED TRANSVERSAL FILTER

BACKGROUND OF THE INVENTION

1. Field of the Invention

The present invention relates to a filter for removing ghost signals or multipath signals from, for example, a received video signal, and more particularly, to an input-weighted transversal filter which performs filtering operations on digital signals, such as video signals, audio signals, etc., in real time.

2. Description of the Related Art

In general, a transversal filter adapted to remove ghosts usually requires 640 taps. The transversal filter is composed of a plurality of integrated-circuit chips. Thus, the number of integrated circuits used for the transversal filter can be decreased by increasing the number of taps per chip.

Coefficient multipliers which multiply a time-series input signal and predetermined coefficients form a large proportion of a transversal filter. Each of the coefficient multipliers is composed mainly of a multiplier. Even if the number of taps remain unchanged, therefore, by operating the coefficient multipliers on a time-division basis, it becomes possible to decrease the number of multipliers and reduce the circuit scale thereof in the transversal filter.

FIG. 6 illustrates a conventional transversal filter, and FIGS. 7A and 7B are its timing chart. This filter circuit illustrates the case where the number of taps is six and the number of coefficients to be time-division multiplexed is two.

In the case of ghost removal, an input signal is sampled at regular intervals T = about 70 nsec. The circuit operates coefficient multipliers on a time-division basis and switches coefficients by which sampled signals are multiplied twice during the interval T.

To an input terminal 1 is applied an input signal a={X(i)} which has been sampled every T. The input signal a is then applied to coefficient multipliers 10, 11, 12. The input signal has a period of T and varies as represented by $$X(i-5), X(i-4), X(i-3), X(i-2), \quad (1)$$

Each of selectors 13, 14 and 15 is supplied with two of coefficients C0 to C5. The two coefficients are selectively supplied to each of coefficient multipliers 10, 11 and 12 by a select signal S. For example, for the multiplier 10, the coefficient C0 is selected by the selector 13 when the select signal is a 1, while the coefficient C1 is selected when the select signal is a 0. In the mutiplier 10, therefore, the selectively applied coefficients and the input signal a={X(i)} are multiplied in sequence and the results of the multiplication are output as follows:

$$C0 \cdot X(i-5), C1 \cdot X(i-5), C0 \cdot X(i-4), C0 \cdot X(i-4),$$
$$C0 \cdot X(i-3), \quad (2)$$

The outputs d, c and b of the multipliers 10, 11 and 12 are applied to adders 16, 17 and 18, respectively. Delay elements 19 to 22 and 23 to 26 are connected in cascade between the adders 16 and 17 and between the adders 17 and 18, thereby constituting a pipeline adder. Each of the delay elements is arranged to introduce a time delay of T/2. Furthermore, delay elements 27 and 28 are connected in cascade between an input terminal 2 and the adder 18. To the input terminal 2 is applied an output signal of the preceding filter stage which is not shown.

Outputs of the multipliers 10 to 12 are added in the adders 16 to 18 and delayed by the delay elements 19 to 22 and 23 to 26 to be output from the adder 16 as data with a period of T/2. The output data alternates, as indicated at e in FIGS. 7A and 7B, between the sum $\Sigma E$ of outputs of even-numbered taps assigned coefficients C0, C2 and C4 and the sum $\Sigma O$ of outputs of odd-numbered taps assigned coefficients C1, C3 and C5 every T/2. The output data is further delayed by delay elements 29 and 30 and then output from an output terminal 3 as cascade data. The cascade data has a period of T/2 = about 35 nsec. Interfacing between transversal filter stages connected in cascade is performed in this interval of about 35 nsec.

Data required finally in a transversal filter having six taps is represented by $$\sum_{j=0}^{5} Cj \, X(i-j) \quad (3)$$

For this reason, as shown in FIG. 6, the transversal filter requires at its final stage a demultiplexer circuit 33 constructed from delay elements 29, 30, an adder 31 and a delay element 32.

The output e of the adder 16 of FIG. 6 alternates, as described, between the sum $\Sigma E$ of outputs of even-numbered taps and the sum $\Sigma O$ of outputs of odd-numbered taps every T/2. Thus, by delaying one of the sums by T/2 with respect to the other in the delay element 30 and adding the input and output of the delay element together in the adder 31, such data as indicated at f in FIGS. 7A and 7B will result. Of such data, each of data pieces which are indicated by oblique lines represents $$C1 \cdot X(i-1) + C3 \cdot X(i-3) + C5 \cdot X(i-5)$$
$$+ C0 \cdot (Xi) + C2 \cdot X(i-2) + C4 \cdot X(i-4),$$

which corresponds to the data expressed by equation (3). Thus, by holding each data piece indicated by oblique lines for the interval T by the delay element 32, output data of the transversal filter proper, which has recovered the period T corresponding to the sampling frequency, can be obtained.

FIG. 8 illustrates a cascade of transversal filter stages TF1, TF2, ..., TFn each constructed as described above. Such a configuration allows the total number of taps to be increased.

As described above, however, data transmitted to the succeeding filter stage as cascade data has a period of T/2 = about 35 nsec, and the interfacing of transversal filters will also be performed with this period. This period is very short. Therefore, when there are variations in manufacturing processes for integrating the transversal filter into chips, it will become difficult to interface a preceding stage with a succeeding stage with this period.

In addition, two output terminals are required: an output terminal 3 for connection to the succeeding transversal filter stage and an output terminal 4 for outputting demultiplexed data at the final stage. Thus, the transversal filter will require twice as many pins as output bits. As a countermeasure for this, output data may be switched by means of a selector to decrease the number of pins. In this case, however, an additional select signal for controlling the selector will be required and moreover an amount of hardware will be increased due to the provision of the selector. Thus, the switching of output data is not advantageous.

SUMMARY OF THE INVENTION

It is the object of the present invention to provide an input-weighted transversal filter which permits a signal of a period of T to be used as cascade data by converting an input signal of a period of T from a preceding transversal filter stage to a signal of a width of T/n, permits the period of interfacing between cascade-connected transversal filter stages to be made longer, allows a margin on errors due to variations in manufacturing processes and permits the number of output terminals to be decreased.

The object of the present invention is attained by an input-weighted transversal filter comprising:

a plurality of operation circuits responsive to a first input signal sampled at intervals T for sequentially outputting signals obtained by multiplying the first input signal and different coefficients;

an input circuit for converting a second input signal supplied at intervals T to a signal having a period of T/2;

pipeline type adder means for sequentially adding the second input signal output from said input circuit and output signals of said operation circuits; and an output circuit for adding an output signal of said adder means in a period of T/n and outputting the result of the addition as a signal of a period of T.

According to the present invention, an input signal is thinned out by the input circuit every T/n and the thinned input signal and output signals of the plural operation circuits are added by the pipeline type adder means. Thus, even if coefficients are time-division multiplexed every T/n for application to the operation circuits, a signal of a period of T can be received. When a plurality of transversal filter stages are connected in cascade, signals can be transferred between the stages with a period of T. For this reason in the case of a integrated-circuit version of the transversal filter, a margin for errors due to variations in manufacturing processes is allowed.

Moreover, the output circuit adds the output of the adder means in a period of T/n and outputs the result of the addition every T. Therefore, it is sufficient to provide a single output, decreasing the number of output pins.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 illustrates a circuit arrangement of an input-weighted transversal filter according to a first embodiment of the present invention;

FIGS. 4A, 4B and 4C are a timing chart illustrating the operation of the transversal filter of FIG. 3;

FIG. 5 illustrates a circuit arrangement of the main portion of a input-weighted transversal filter according to a third embodiment of the present invention;

DETAILED DESCRIPTION OF THE PREFERRED EMBODIMENTS

Hereinafter, the preferred embodiments of the present invention will be described with reference to the accompanying drawings.

Figure 2A:
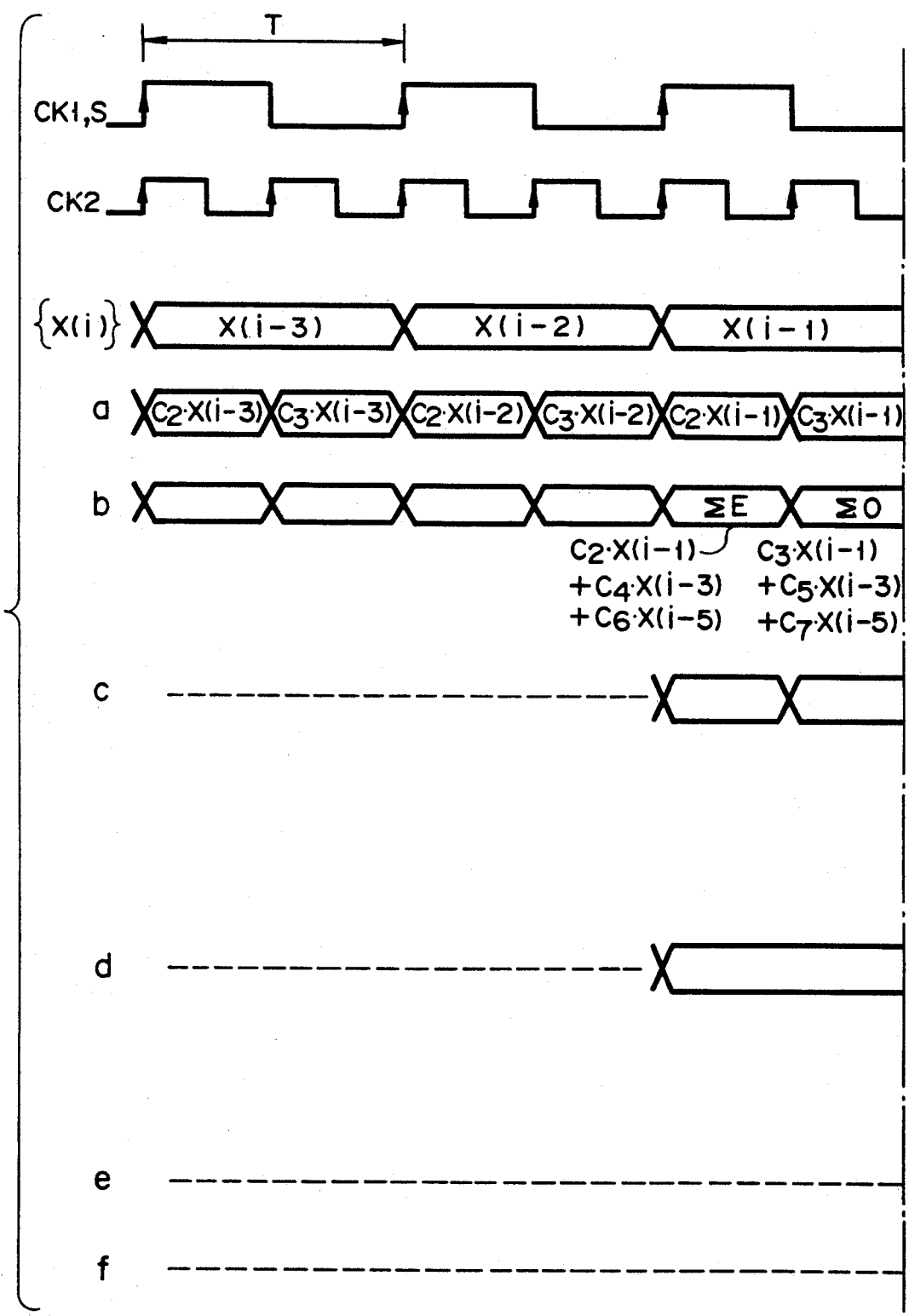
FIGS. 2A and 2B are a timing chart illustrating the operation of the transversal filter of FIG. 1.
Figure 2B:
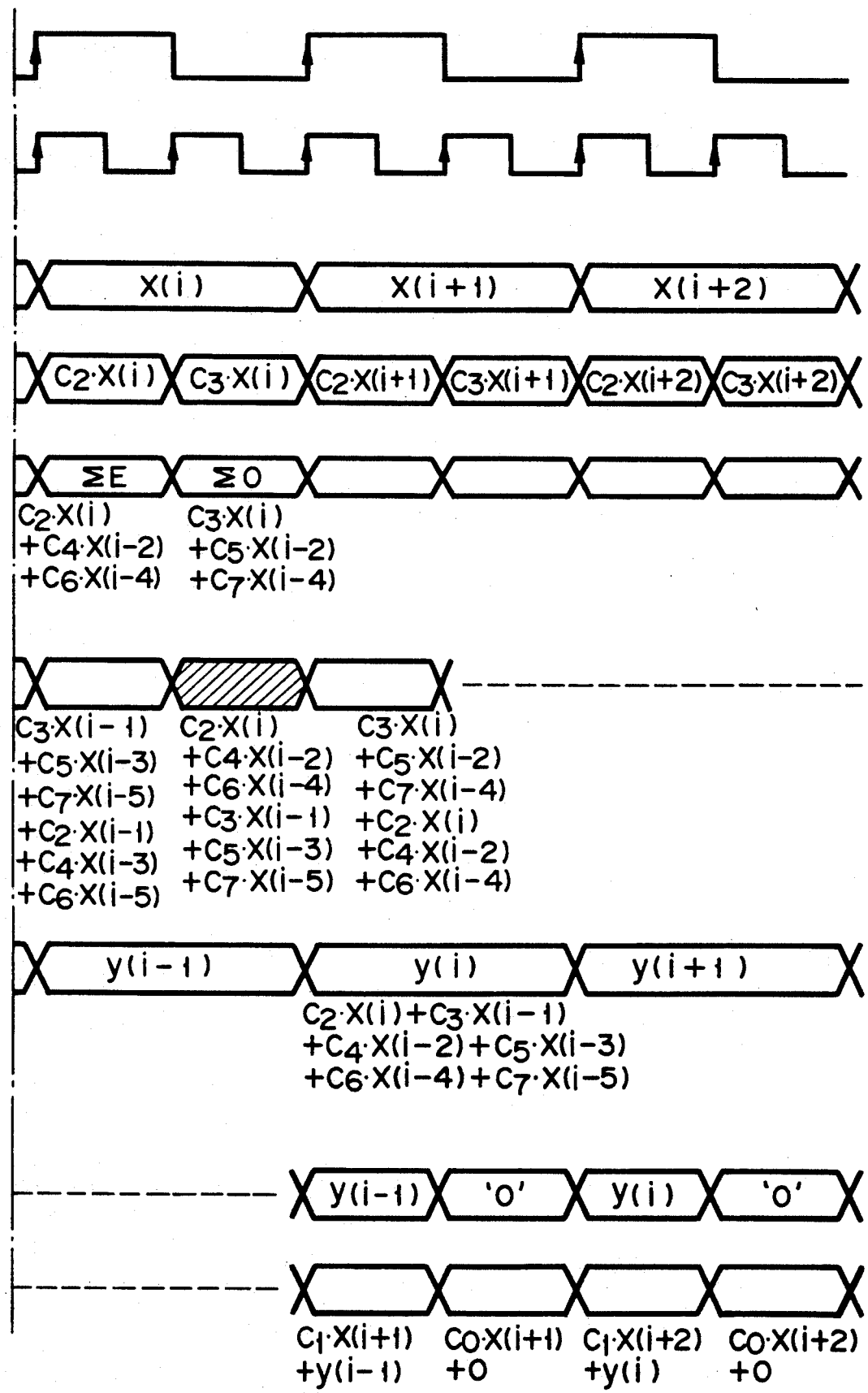

FIG. 1 illustrates an example of a cascade connection of transversal filter stages of the present invention, and FIGS. 2A and 2B are a timing chart illustrating the operation thereof.

In this embodiment, let the number of taps of an integrated circuit comprising a transversal filter stage be six and the number of time-division multiplexed coefficients be two.

An input terminal 40 of a transversal filter stage TF1 is connected to receive an input signal $A = \{X(i)\}$ which has been sampled at intervals T. The input signal A is applied to coefficient multipliers 41, 42 and 43. Selectors 44, 45 and 46 are connected to the multipliers 41, 42 and 43, respectively. The selector 44 is responsive to a select signal to select either of coefficients C2 and C3. The selector 45 selects either of coefficients C4 and C5 in response to the select signal. Also, the selector 46 selects either of coefficients C6 and C7. Each of the multipliers 41, 42 and 43 multiplies the input signal a by a selected coefficient. The outputs of the multipliers 41, 42 and 43 are applied to adders 47, 48 and 49, respectively. Delay elements 50, 51, 52 and 53 are interposed between the adders 47 and 48. Similarly delay elements 54, 55, 56 and 57 are interposed between the adders 48 and 49. Each of these delay elements is adapted to introduce a time delay of T/2. The adders 47 to 49 and the delay elements 50 to 57 constitute a pipeline adder.

On the other hand, an input terminal 58 of the transversal filter TF1 is connected to receive an output signal of the preceding transversal filter stage not shown. The output signal is applied to the adder 49 via a decimation circuit 59, which is constructed from a delay element 60 introducing a time delay of T and an AND circuit 61 which is responsive to the select signal S to output an output signal of the delay element 60.

Between the adder 47 and an output terminal 62 of the transversal filter stage TF1 is connected a demultiplexer circuit 63, which is constructed from delay elements 64 and 65, an adder 66 and a delay element 67. The delay element 64 introduces a time delay of T/2 to an output signal of the adder 47, while the delay element 65 introduces a time delay of T/2 to an output signal of the preceding delay element 64. The adder 66 adds output signals of the delay elements 64 and 65 together. The delay element 67 introduces a time delay of T to an output signal of the adder 66.

Furthermore, to a first clock input terminal 68 of the transversal filter stage TF1 is applied a clock signal CK1, which, in turn, is applied to the delay element 60 of the decimation circuit 59 and to the delay element 67 of the demultiplexer circuit 63. Also, to a second clock input 69 of the transversal filter TF1 is applied to a clock signal CK2, which, in turn, is applied to the delay elements 50 to 57, 64 and 65.

The succeeding transversal filter stage TF2 is the same in configuration as the preceding transversal filter stage TF1. The same parts as those in the transversal filter TF1 are designated by like reference numerals subscripted with the letter a.

In the transversal filter stage TF2, an input terminal 40a is connected to receive the input signal a={X(i)}. The sampled input signal a is applied to a coefficient multiplier 43 and so on. A selector 46a is responsive to the select signal S to select either of the coefficients C0 and C1. The coefficient C0 or C1 selected by the selector is applied to the multiplier 43a. The result of the multiplication in the multiplier 43a is applied to an adder 49a. Between the adder 49a and an input terminal of the transversal filter stage TF2 is connected a decimation circuit 59a, which is constructed from a delay element 60a which introduces a time delay of T to an input signal {y(i)} from the preceding transversal filter stage TF1 and an AND circuit 61a which is responsive to the select signal S to output an output signal of the delay element 60a. A first clock input 68a of the transversal filter stage TF2 is also connected to receive the clock signal CK1, which, in turn, is applied to the delay element 60a of the decimation circuit 59a and so on.

Figure 6:
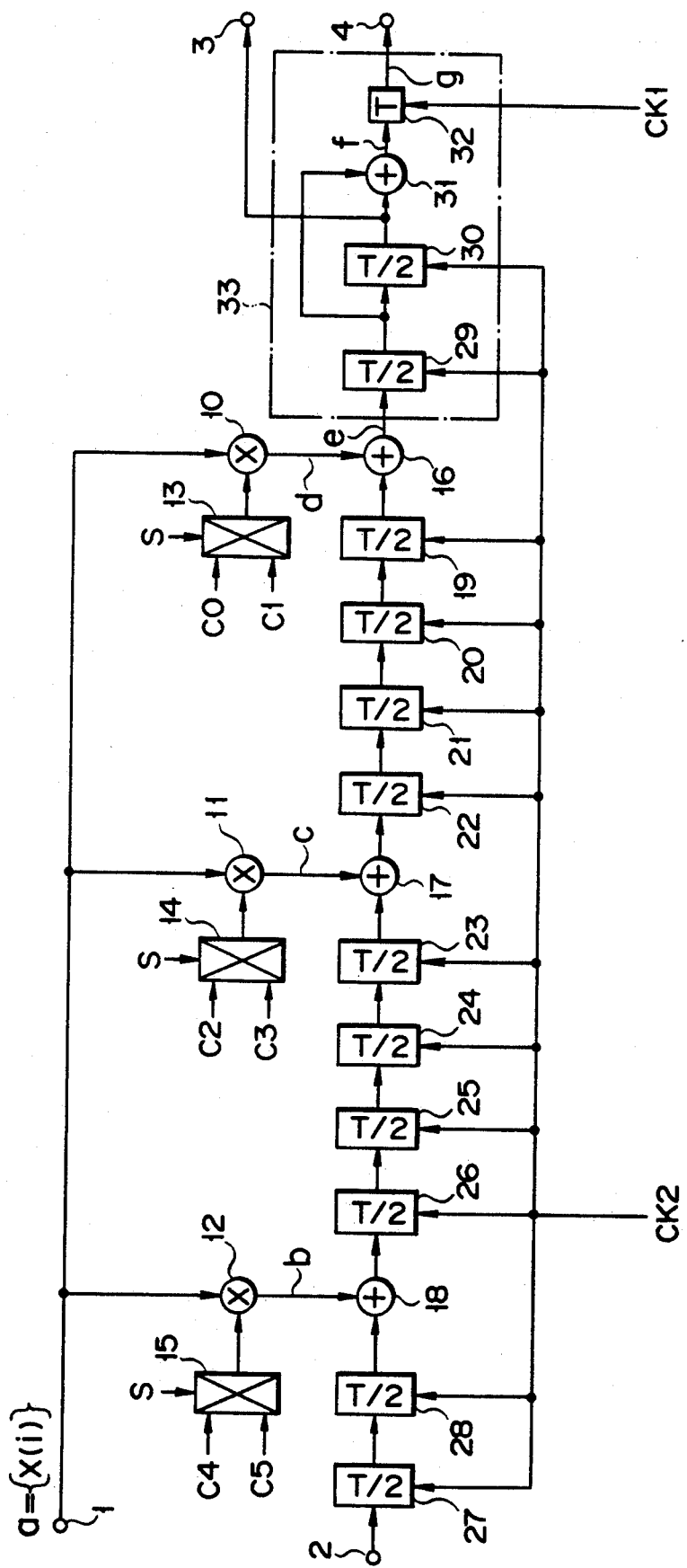
FIG. 6 illustrates a circuit arrangement of a conventional input-weighted transversal filter.
Figure 7A:
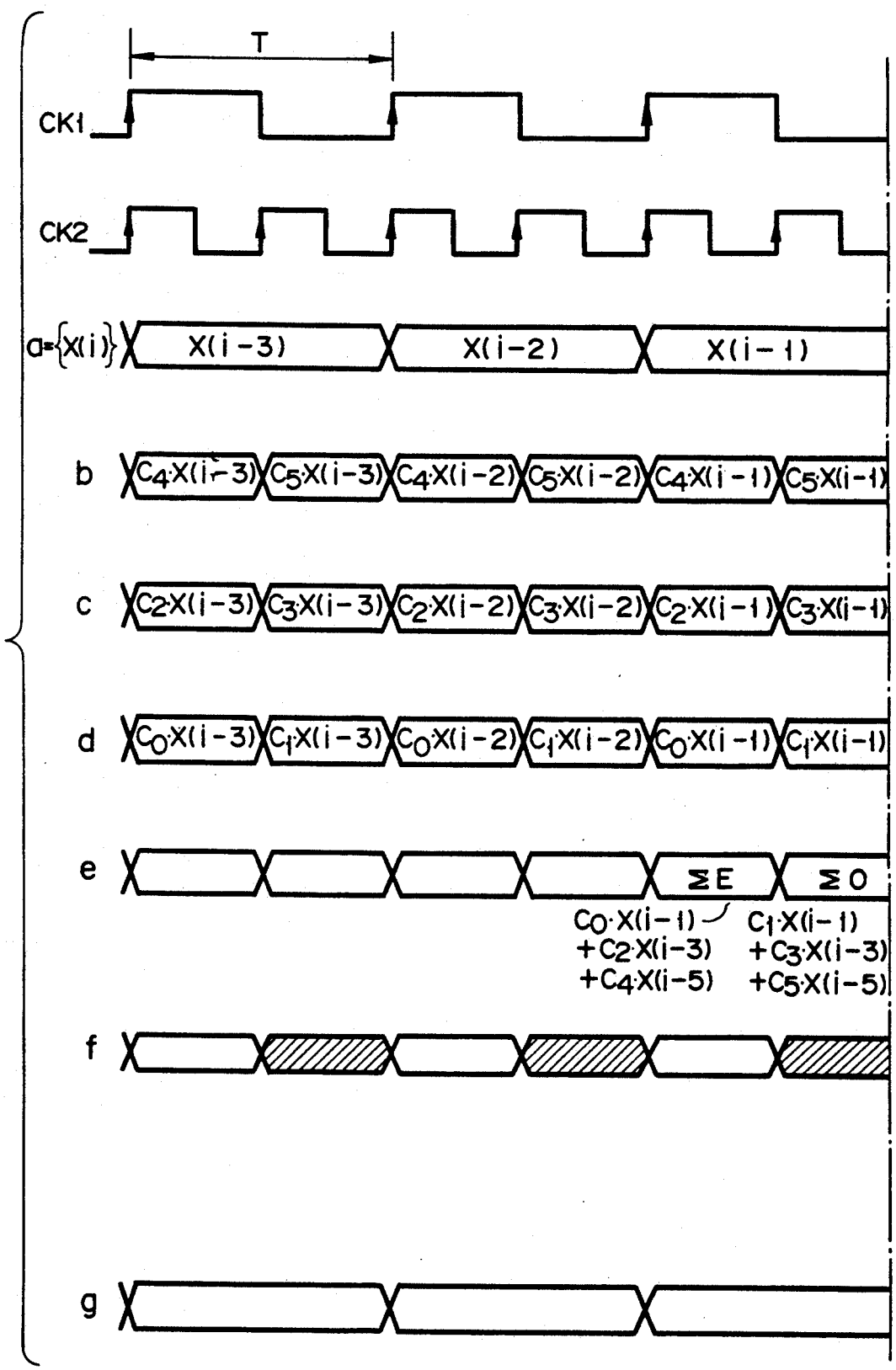
FIGS. 7A and 7B are a timing chart illustrating the operation of the transversal filter of FIG. 6.
Figure 7B:
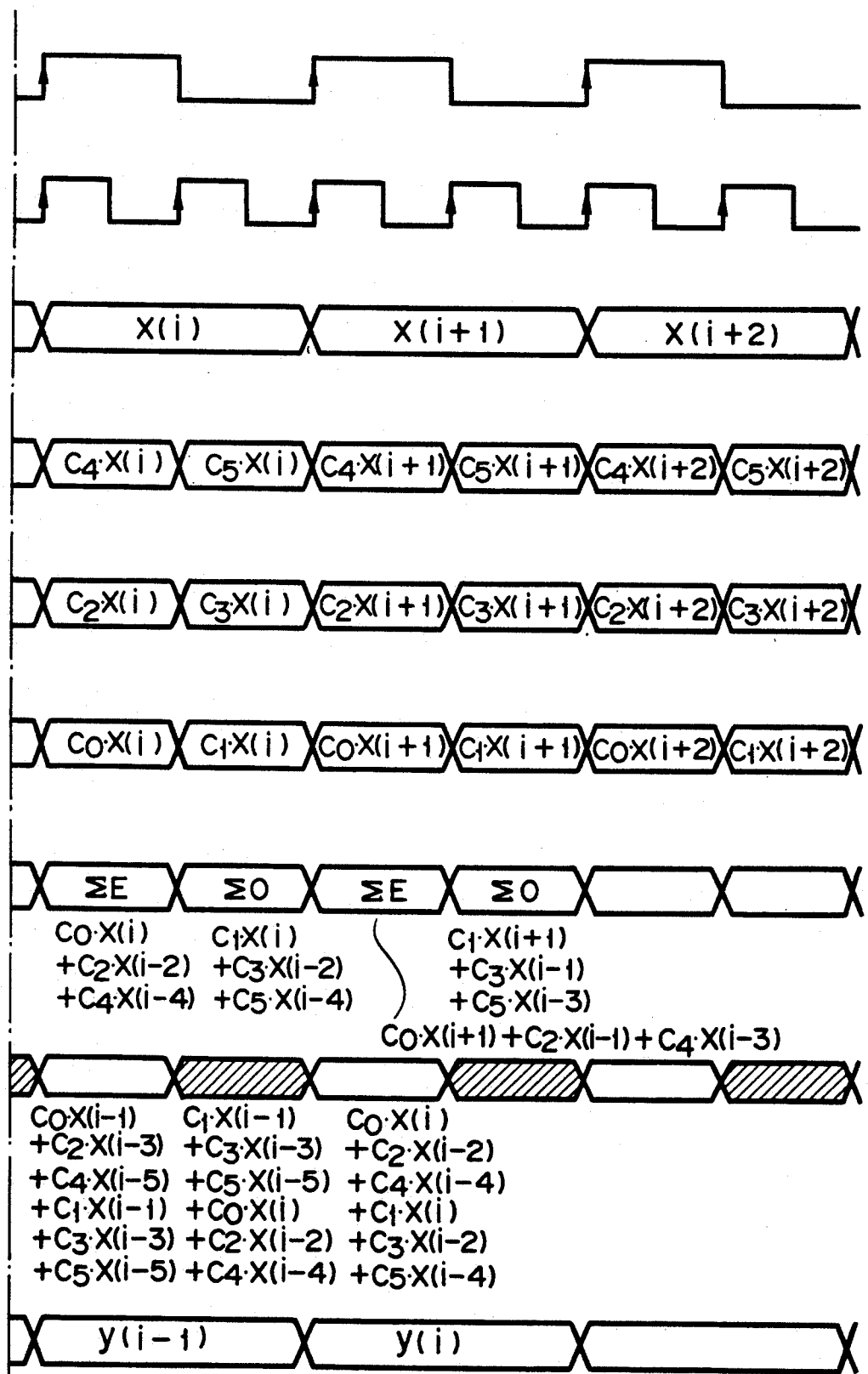
Figure 8:
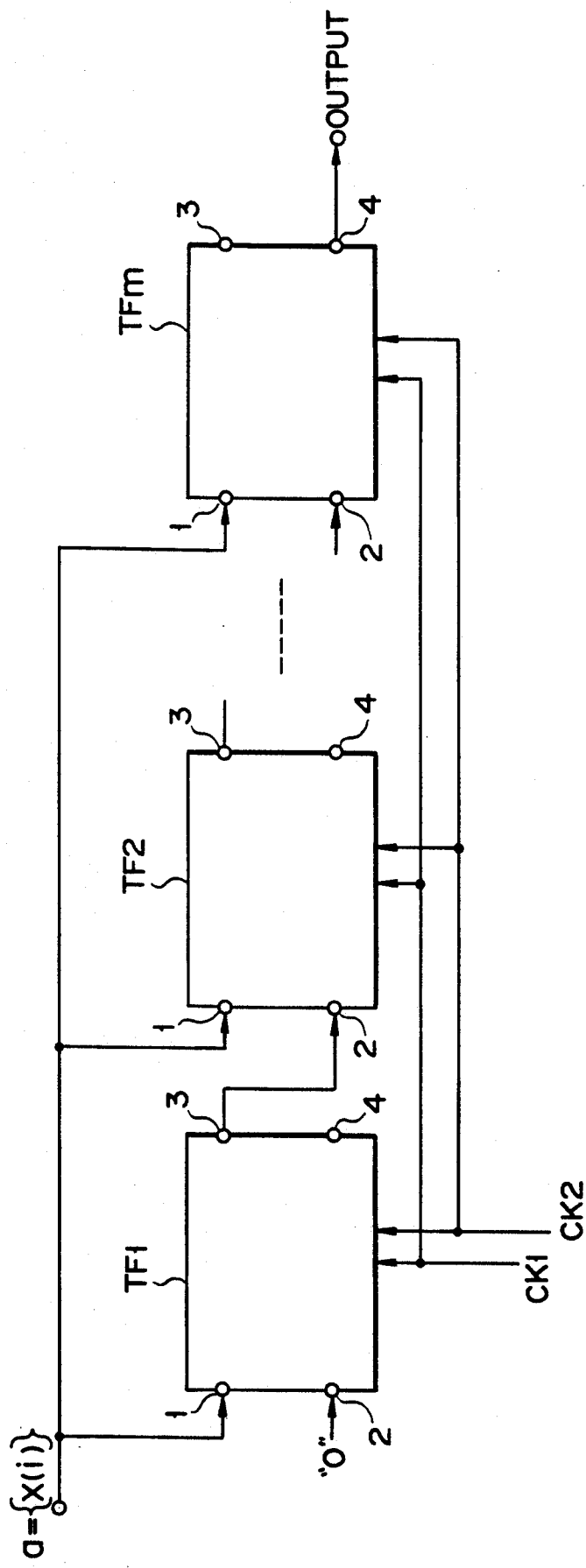
FIG. 8 illustrates a cascade connection of input-weighted transversal filters of FIG. 6.

It is to be noted that the operations of the coefficient multipliers 41 to 43, the selectors 44 to 46 and the adders 47 to 49 are the same as those of the coefficient multipliers 10 to 12, the selectors 13 to 15 and the adders 16 to 18 which are shown in FIG. 6.

The output of the adder 47 alternates, as indicated in b in FIGS. 2A and 2B, between the sum $\Sigma E$ of outputs of even-numbered taps having C2, C4 and C6 as their respective tap coefficients and the sum $\Sigma O$ of outputs of odd-numbered taps having C3, C5 and C7 as their respective tap coefficients every T/2. In the adder 66 of the demultiplexer circuit 63, data output from the adder 47 and delayed by T/2 by the delay element 64 are added together. Thus, such data as indicated in c in FIGS. 2A and 2B is output from the adder 66. Here, only data indicated by oblique hatching is necessary data. The data in the interval T before and after the necessary data has no significance as cascade data. Thus, by delaying the data indicated by oblique hatching by T by the delay element 69, the data will be returned to data {y(i)} of a period of T as indicated in d in FIGS. 2A and 2B. Since the data {y(i)} is applied to the succeeding transversal filter stage TF2, the interfacing between the transversal filters TF1 and TF2 can be performed with a period of T.

In the transversal filter stage TF2, the input data {y(i)} is delayed by T by the delay element 60a to adjust delay amounts between taps. Subsequently, the signal {y(i)} is output from the AND circuit 61a only during the interval T/2 when the select signal goes to a 1. During the interval T/2 when the select signal goes to a 0, 0 is applied to the adder 49a as cascade data. Therefore, the data {y(i)} is converted to data having a period of T/2 and data becomes 0 during intervals T/2 before and after the data {y(i)} as indicated in e in FIGS. 2A and 2B. Thereby, data y(i) and y(i−1) will not be added together in the demultiplexer circuit (not shown) of the transversal filter TF2 even if a delay of T/2 is introduced and an addition is made in the demultiplexer circuit not shown.

According to the above embodiment, data of a period of T can be used as cascade data by the provision of the decimation circuit in the input section of the transversal filter.

Moreover, the output signal of the adder 47 is output converted to an input signal of a period of T for the succeeding transversal filter stage by the demultiplexer circuit. Therefore, a single data output suffices and hence the number of output pins can be made equal to the number of bits when the transversal filter is integrated.

Furthermore, the interfacing between the transversal filter stages TF1 and TF2 can be performed in T=70 nsec, which is longer than T/2=35 nsec in the prior art. For this reason, the transversal filters can be controlled successfully even if there are variations in transversal filters due to manufacturing processes for integrated circuits.

Figure 3:
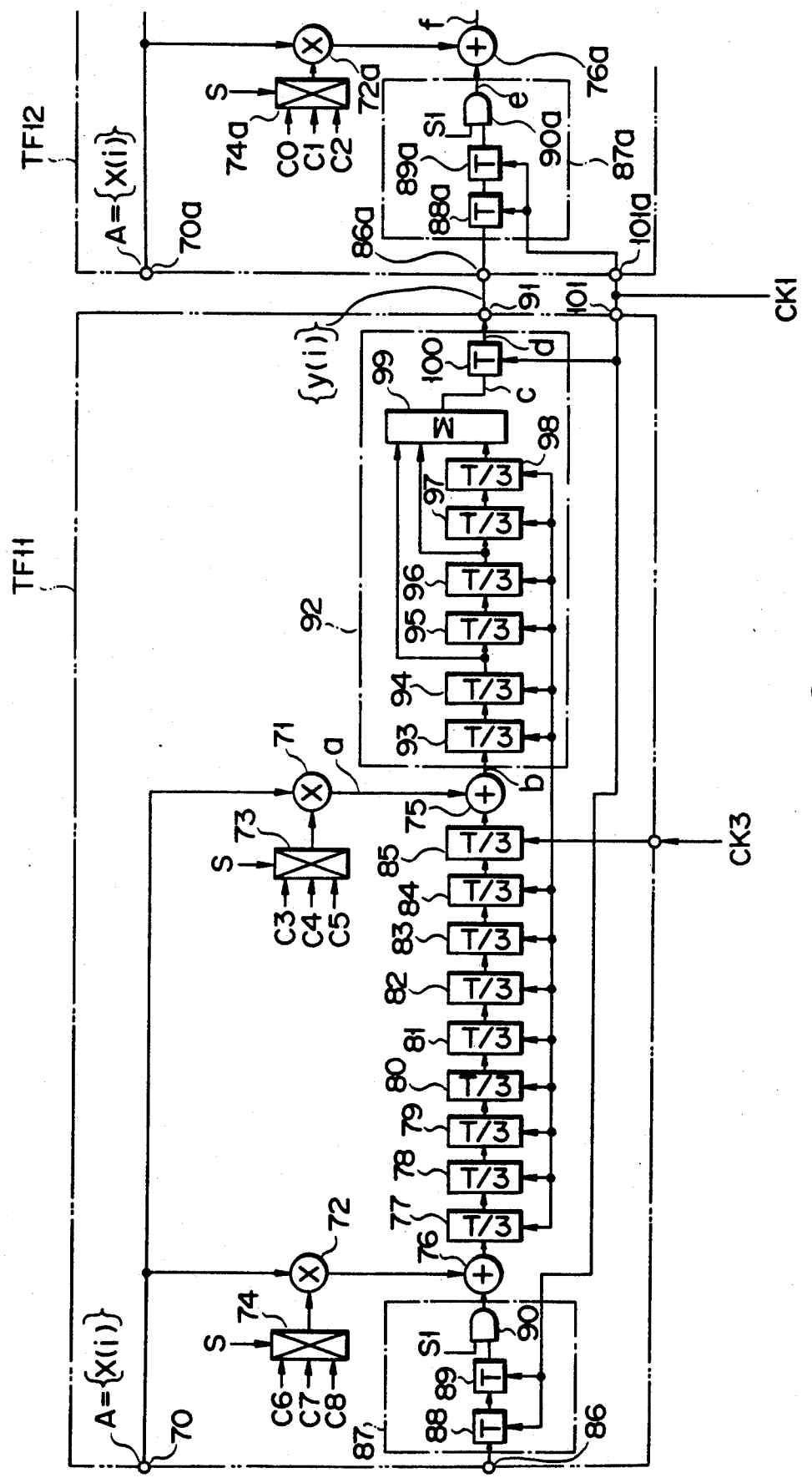
FIG. 3 illustrates a circuit arrangement of an input-weighted transversal filter according to a second embodiment of the present invention.

FIG. 3 illustrates a third embodiment of the present invention. In this embodiment, the number of taps of each of integrated circuits constituting a transversal filter stage is six and the number of time-division multiplexed coefficients is three.

An input terminal 70 of a transversal filter stage TF11 is connected to receive an input signal A={X(i)} which has been sampled at regular intervals T. The input signal A is applied to coefficient multipliers 71 and 72 to which selectors 73 and 74 are connected, respectively. The selector 73 selects one of coefficients C3, C4 and C5 in response to a select signal S. The selector 74 is responsive to the select signal S to select one of coefficients C6, C7 and C8. The multipliers 71 and 72 multiply the input signal A by coefficients selected by the selectors 73 and 74. The results of the multiplication by the multipliers 71 and 72 are applied to adders 75 and 76, respectively. Between the adders 75 and 76 are interposed delay elements 77 to 85 each introducing a time delay of T/3. These adders 75 and 76 and the delay elements 77 to 85 constitute a pipeline adder.

On the other hand, an input terminal 86 of the stage TF11 is connected to receive an output signal of the preceding transversal filter stage not shown. The output signal is applied to the adder 76 via a decimation circuit 87. The multiplexer circuit 87 is constructed from a cascade of delay elements 88 and 89 each introducing a time delay of T in a signal and an AND circuit 90 which is responsive to a select signal S1 to output an output signal of the cascade of the delay elements 88 and 89.

Between the adder 75 and the output terminal 91 and an output terminal of the transversal filter stage TF11 is interposed a demultiplexer circuit 92, which is constructed from delay circuits 93, 94, 95, 96, 97 and 98 which delay an output signal of the adder 75 by T/3 in succession, an adder 99 for adding output signals of the delay elements 94, 96 and 98 together and a delay element 100 for delaying an output signal of the adder 66 by T.

To a first clock input terminal 101 is applied a clock signal which, in turn, is applied to the delay elements 88 and 89 of the decimation circuit 87 and the delay element 100 of the demultiplexer circuit 92. Also, to a second clock input terminal 102 is applied a clock signal CK3 whose frequency is triple that of the clock signal CK1. The clock signal CK3 is applied to the delay elements 77 to 85 and 93 to 98.

On the other hand, a transversal filter stage TF12 is the same in arrangement as the transversal filter stage TF11. The corresponding parts to those of the stage TF11 are designated by like reference numerals subscripted with a.

Figure 4B:
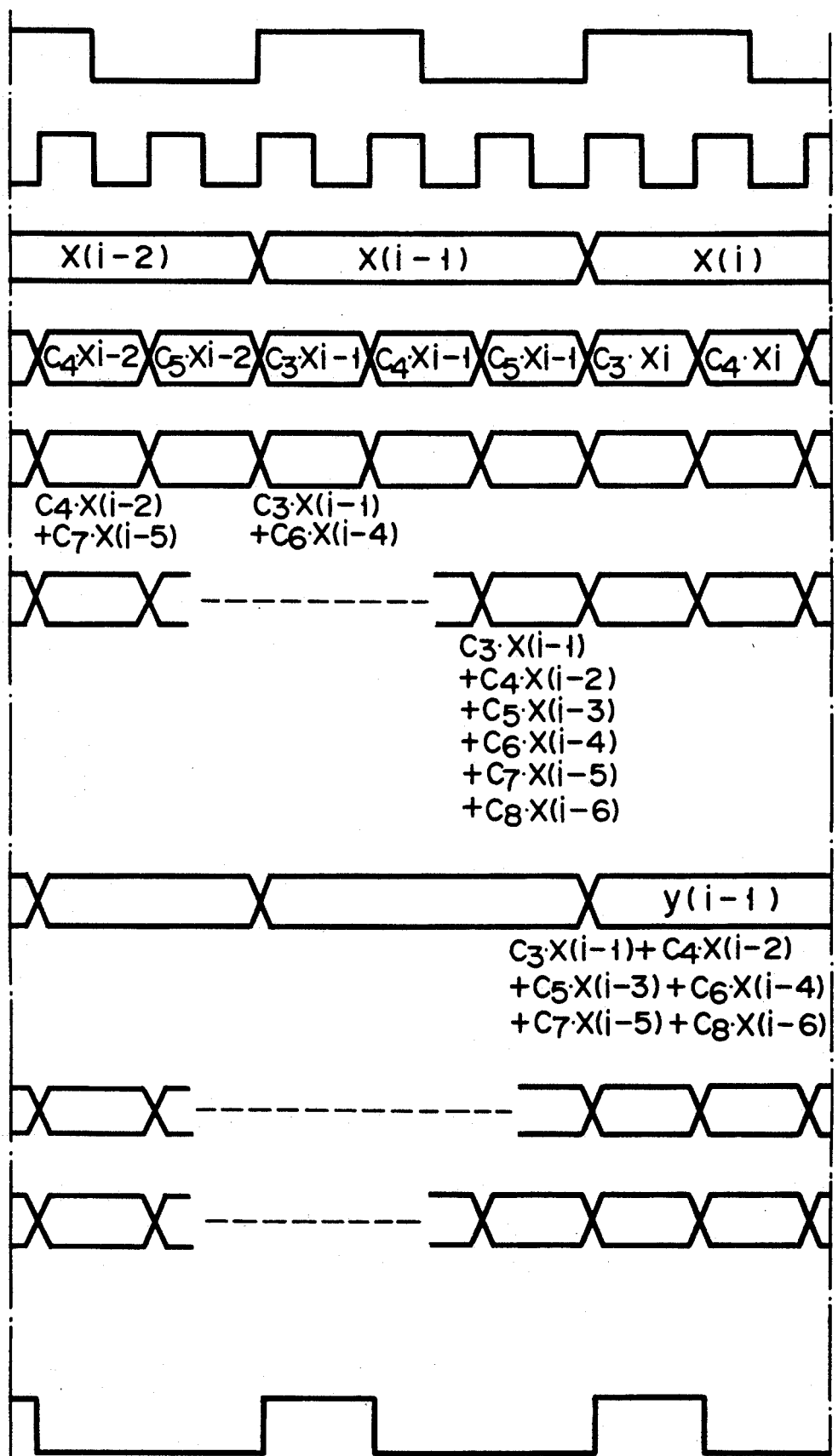
Figure 4C:
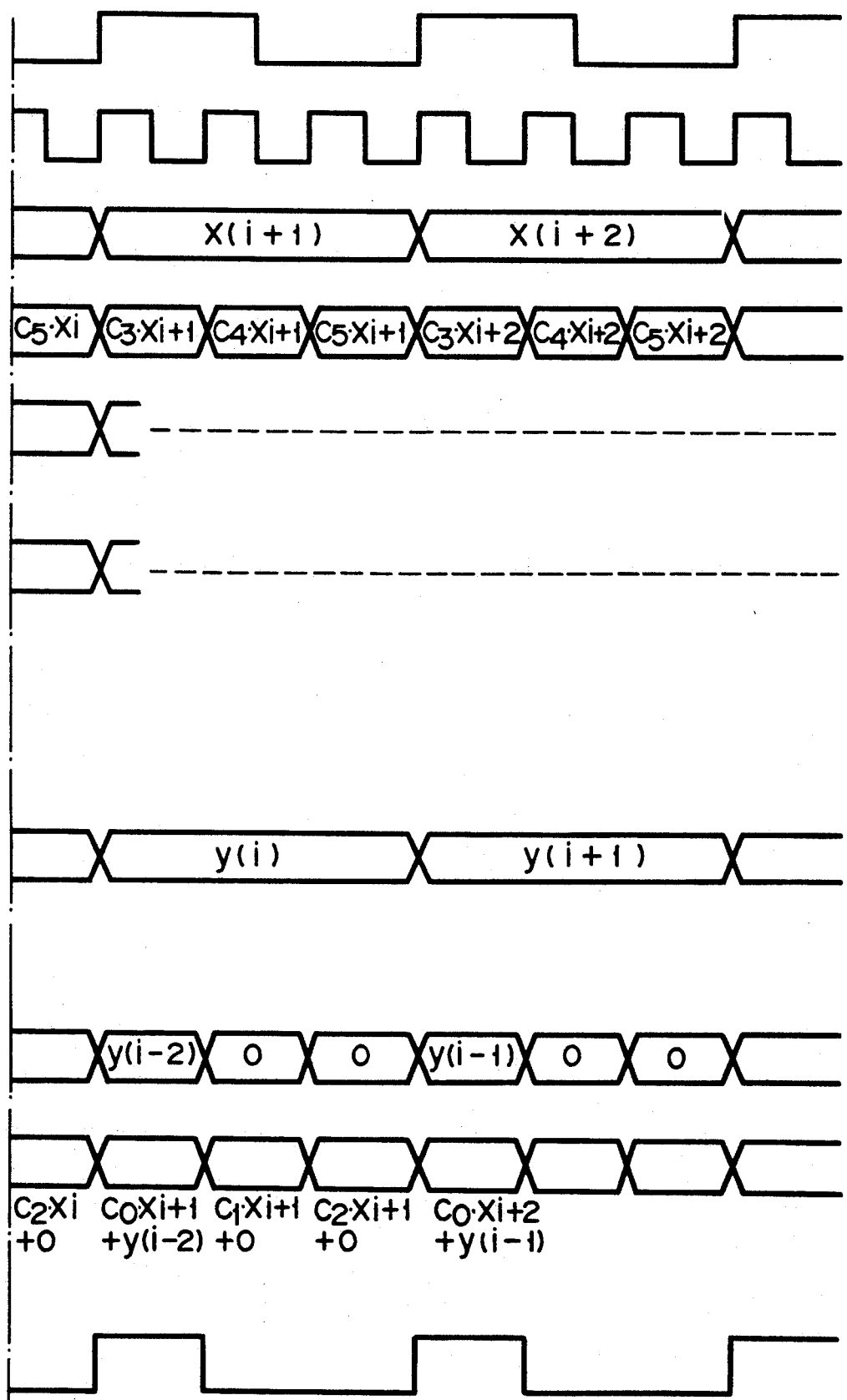

In the transversal filter stage TF12, an input terminal 70a is connected to receive the input signal A={X(i)}, which, in turn, is applied to a coefficient multiplier 72a and so on. A selector 74a is responsive to the select signal S to select one of coefficients C0, C1 and C2. A coefficient selected by the selector 74a is applied to the multiplier 72a. The result of the multiplication by the multiplier 72a is applied to an adder 76a. Between the adder 76a and an input terminal 76a of the transversal filter stage TF12 is connected a multiplexer circuit 87a, which is constructed from delay elements 88a and 89a which delay an output signal {y(i)} of the transversal filter stage TF11 in succession by T and an AND circuit 90a which is responsive to the select signal to output an output signal of the delay element 89a. To a first clock input terminal 101a is applied the clock signal CK1, which, in turn, is applied to the delay elements 88a and 89a of the decimation circuit 87a and so on. The select signal S1, as indicated in FIGS. 4A, 4B and 4C, are equal to the clock signal CK1 in frequency but differs therefrom in duty factor.

In the above arrangement, the coefficient multipliers 71, 72 and 72a, the selectors 73, 74 and 74a and the adders 75, 76 and 76a operate in the same manner as corresponding ones of the multipliers 41 to 43, the selectors 73, 74 and 74a and the adders 75, 76 and 76a illustrated in FIG. 1.

Three data pieces having C5 and C8; C4 and C7; and C3 and C6 as tap coefficients are sequentially output from the adder 75 at intervals T/3 as indicated at b in FIGS. 4A, 4B and 4C. These data pieces are applied to the demultiplexer circuit 92 so that they are delayed in sequence by the delay elements 93 to 98. The adder 99 adds data output from the delay elements 94, 96 and 98 together. Data indicated by oblique hatching in c of FIGS. 4A, 4B and 4C are output from the adder 99. The output data is delayed by T by the delay element 100, so that it returns to data {y(i)} of a period of T as indicated in d of FIGS. 4A, 4B and 4C. The data {y(i)} is input to the succeeding stage TF12. Therefore, the interfacing between the transversal filter stages TF11 and TF12 can be performed at intervals T.

In the transversal filter stage TF12, the input data {y(i)} is delayed by the delay elements 88a and 89a each having a delay amount of T to adjust delay amounts between taps. Subsequently, the {y(i)} is output from the AND circuit 90a only during the interval of T/3 when the select signal S1 goes to a 1. During the interval of 2T/3 when the select signal S1 goes to a 0, "0" data is applied to the adder 76a as cascade data. Thus, the data {y(i)} is converted to data of a period of T/3 and data in a period of 2T/3 before and after the data {y(i)} becomes Os. Thereby, data y(i) and y(i−1) will not be added together even if a time delay of 2T/3 is introduced and an addition is made in the demultiplexer circuit not shown of the transversal filter stage TF12.

According to the second embodiment as well, the interfacing between the transversal filter stages can be performed at intervals T.

FIG. 5 illustrates a third embodiment of the present invention. The embodiment is a modification of the circuit of FIG. 1 and only its main portion is illustrated.

In the first embodiment, coefficient multipliers were used to multiply a sampled input signal and coefficients. In the third embodiment, read only memories (ROMs) are used in place of the coefficient multipliers. The results of multiplication of an input signal {X(i)} and coefficients Ci1, Ci2, . . . are stored in ROMs 110 and 111. The contents of the ROMs are addressed by the input signal {X(i)}. According to the third embodiment, filtering operations can be performed on the input signal {X(i)} by the use of a straightforward circuit configuration.

Note that random access memories (RAMs) may be used in place of the ROMs.

Although the third embodiment is adapted to the first embodiment, it may be adapted to the second embodiment.

Although the preferred embodiments of the present invention have been described and disclosed, it is apparent that other embodiments and modifications are possible.

What is claimed is:

1. An input-weighted transversal filter comprising:
   a plurality of operation circuits responsive to a first input signal sampled at intervals T for sequentially outputting signals obtained by multiplying the first input signal and different coefficients;
   an input circuit for selecting, at intervals of T/2, a second input signal which is supplied to said input circuit at intervals of T;
   pipeline type adder means for sequentially adding the second input signal output from said input circuit and output signals of said operation circuits; and
   an output circuit for adding an output signal of said adder means in a period of T/n and outputting the result of the addition as a signal of a period of T.

2. A filter according to claim 1, in which each of said operation circuits comprises a selector for selecting a plurality of different coefficients during the interval T and a multiplier for multiplying the first input signal and each of the different coefficients selected by said selector.

3. A filter according to claim 1, in which each of said operation circuits comprises a storage circuit for storing the results of multiplication of the first input signal and the different coefficients, the results stored in said storage circuit being addressed by the first input signal to be sequentially read from said storage circuit.

4. A filter according to claim 1, in which said input circuit comprises a delay element having a delay time of T and a selector for selecting signals output from said delay element at intervals T in response to said selected signals.

5. A filter according to claim 1, in which said pipeline type adder means comprises a cascade of $n^2$ delay elements each having a delay time of T/n and an adder circuit for adding signals output from said delay elements and signals output from said operation circuits.

6. A filter according to claim 1, in which said output circuit comprises n delay elements each delaying an output signal of said adder means by $(n-1)T/n$ and an adder circuit for adding output signals of said delay elements together.

7. An input-weighted transversal filter comprising:
   a plurality of selectors each or sequentially selecting two coefficients during an interval T;
   a plurality of coefficient multipliers for multiplying a first input signal sampled at intervals T and coefficients selected by said selectors;
   an input circuit for selecting, at intervals of T/2, a second input signal which is sampled at intervals of T and supplied to said input circuit;
   a pipeline type adder for sequentially adding the second input signal output from said input circuit and outputs of said coefficient multipliers; and an output circuit for adding an output signal of said adder in an interval T/2 and outputting the result of the addition as a signal of a period of T.

8. An input-weighted transversal filter comprising:

a plurality of selectors for sequentially selecting three coefficients during a time interval T;

a plurality of coefficient multipliers for multiplying a first input signal sampled at intervals T and coefficients selected by said selectors;

an input circuit for selecting, at intervals of T/3, a second input signal which is supplied to said input circuit at intervals of T;

a pipeline type adder for sequentially adding the second input signal output from said input circuit and outputs of said coefficient multipliers; and an output circuit for adding an output signal of said adder in a period of T/3 and outputting the result of the addition as a signal of a period of T.

* * * * *